United States Patent
Chuo et al.

(10) Patent No.: US 9,577,304 B2
(45) Date of Patent: Feb. 21, 2017

(54) ATTENUATION REDUCTION STRUCTURE FOR HIGH FREQUENCY SIGNAL CONNECTION PADS OF CIRCUIT BOARD WITH INSERTION COMPONENT

(71) Applicant: ADVANCED FLEXIBLE CIRCUITS CO., LTD., Taoyuan County (TW)

(72) Inventors: Chih-Heng Chuo, Taoyuan County (TW); Gwun-Jin Lin, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 223 days.

(21) Appl. No.: 14/637,898

(22) Filed: Mar. 4, 2015

(65) Prior Publication Data

US 2015/0270593 A1 Sep. 24, 2015

(30) Foreign Application Priority Data

Mar. 20, 2014 (TW) .............................. 103110425 A

(51) Int. Cl.
| | |
|---|---|
| H03H 7/38 | (2006.01) |
| H01P 1/22 | (2006.01) |
| H05K 1/02 | (2006.01) |
| H05K 1/11 | (2006.01) |
| H05K 1/18 | (2006.01) |
| H05K 3/34 | (2006.01) |

(52) U.S. Cl.
CPC ................ *H01P 1/227* (2013.01); *H03H 7/38* (2013.01); *H05K 1/0225* (2013.01); *H05K 1/0251* (2013.01); *H05K 1/116* (2013.01); *H05K 1/189* (2013.01); *H05K 3/3447* (2013.01); *H05K 2201/0715* (2013.01); *H05K 2201/093* (2013.01); *H05K 2201/0939* (2013.01); *H05K 2201/09381* (2013.01); *H05K 2201/09718* (2013.01); *H05K 2201/10931* (2013.01)

(58) Field of Classification Search
CPC .............. H01P 1/227; H01P 1/22; H03H 7/38; H05K 1/113; H05K 1/114; H05K 1/0251; H05K 1/0253
USPC .................................. 333/32, 33, 81 A, 81 R
See application file for complete search history.

(56) References Cited

U.S. PATENT DOCUMENTS

| | | | | |
|---|---|---|---|---|
| 8,198,954 B2 * | 6/2012 | Makino | ................... | H01P 5/085 333/238 |
| 2006/0208835 A1 * | 9/2006 | Lee | ........................ | H01P 5/085 333/260 |
| 2009/0133913 A1 * | 5/2009 | Kushta | .............. | H01L 23/49827 174/260 |

(Continued)

*Primary Examiner* — Stephen E Jones
(74) *Attorney, Agent, or Firm* — Rosenberg, Klein & Lee

(57) ABSTRACT

Disclosed is an attenuation reduction structure for high-frequency connection pads of a circuit board with an insertion component. The circuit board includes at least one pair of differential mode signal lines formed thereon. A substrate has upper and lower surfaces respectively provided with at least one pair of upper connection pads and lower connection pads. A first metal layer is formed on the lower surface of the substrate. The first metal layer includes an attenuation reduction grounding pattern structure. The attenuation reduction grounding pattern structure includes a hollow area and at least one protruded portion. The protruded portion extends from the first metal layer in a direction toward the lower connection pads.

7 Claims, 4 Drawing Sheets

(56) References Cited

U.S. PATENT DOCUMENTS

2012/0032752 A1* 2/2012 Song .................. H01P 3/006
333/33
2013/0342280 A1* 12/2013 Blanton .................. H01P 5/02
333/33

* cited by examiner

ATTENUATION REDUCTION STRUCTURE FOR HIGH FREQUENCY SIGNAL CONNECTION PADS OF CIRCUIT BOARD WITH INSERTION COMPONENT

BACKGROUND OF THE INVENTION

1. Field of the Invention

The present invention relates to an attenuation reduction structure for circuit board, and in particular to an attenuation reduction structure for high-frequency signal connection pads of a circuit board with an insertion component.

2. The Related Arts

In various electronic devices that are used contemporarily, due to the amount of data transmitting through signal lines getting increasingly large, the number of signal lines involved is also getting larger and the frequency of the transmitted signal is higher. Differential mode signal transmission techniques have been widely used to suppress electromagnetic interference (IMF). For example, USB (Universal Serial Bus), LVDS (Low Voltage Differential signaling), and EPD (Embedded Display Port) have all widely adopted such techniques of signal transmission in order to suppress IMF.

Although the differential mode signal transmission can greatly overcome problems occurring in the transmission of signals, poor designs may still result in issues concerning signal reflection, dissipation of electromagnetic waves, missing or failure of transmission and reception of signals, and waveform distortion of signals. These problems of signal transmission are even worse for flexible circuit boards having a reduced substrate thickness. The causes of such problems include: poor matching of characteristic impedance in the longitudinal extension direction of differential mode signal lines, poor control of excessive parasitic capacitive effect between the differential mode signal lines and a grounding layer, poor control of excessive parasitic capacitive effect between a high-frequency connection pad zone and a grounding layer, and characteristic impedances of differential mode signal lines and a high-frequency connection pad zone being not matched.

Heretofore, various techniques have been proposed to overcome the impedance matching problems of differential mode signal lines of a flexible circuit board. However, at the site of connection between differential mode signal lines and a high-frequency connection pad zone formed on a flexible circuit board and the neighboring area thereof, the line widths of the differential mode signal lines (which are extremely small) and signal conduction pins of a connector and size specification of components (which are of a relatively large size compared to the line widths of the signal lines) impose limitations to the solution of such problems. Thus, it is an issue for those involved in this art to overcome the deficiency of the known techniques.

SUMMARY OF THE INVENTION

Thus, the primary object of the present invention is to provide an attenuation reduction structure for high-frequency signal connection pads of a circuit board with an insertion component, wherein an attenuation reduction grounding pattern structure is provided to achieve excellent impedance matching between the connection pads and the insertion component.

Another object of the present invention is to provide a nonsymmetrical contour structure of connection pads that helps improve utilization of space between differential mode signal lines and vias and connection pads of a circuit board.

To achieve the above objects, the present invention provides an attenuation reduction structure of an insertion component high-frequency connection pads. A substrate of a flexible circuit board has upper and lower surfaces respectively provided with at least a pair of lower connection pads and at least a pair of upper solider pads. At least a pair of differential mode signal lines is formed on an extension section of the substrate to be adjacent to and spaced from each other and respectively connected to the adjacent upper connection pads. The at least a pair of differential mode signal lines transmit at least one high-frequency differential mode signal. The site where the differential mode signal lines and the upper connection pads are connected to each other is defined as a transition zone. A plurality of vias is formed in the via arrangement zone and the vias respectively extend through and are connected to the upper connection pads and the lower connection pads. The lower surface of the substrate comprises a first metal layer formed thereon. The first metal layer comprising an attenuation reduction grounding pattern structure formed at a location corresponding to the transition zone. The attenuation reduction grounding pattern structure comprises a hollow area, which corresponds to the via arrangement zone, the hollow area covering the transition zone; and at least one pair of protruded portions, which extends from the first metal layer in a direction toward the lower connection pads so as to extend a predetermined length to the transition zone and respectively correspond to the differential mode signal lines.

The insertion component comprises insertion pins that are respectively inserted from the upper surface of the substrate through the vias to project beyond the lower surface and soldered and fixed in position to the lower connection pads by solder.

The insertion component comprises insertion pins that are respectively inserted from the lower surface of the substrate through the vias to project beyond the upper surface and soldered and fixed in position to the upper connection pads by solder.

The protruded portions each comprise a gradually reducing width such that the protruded portions have a large width at connection thereof with the first metal layer and the width is gradually reduced in the extension direction toward the lower connection pads.

The upper surface of the substrate further comprises a second metal layer serving as one of a shielding layer, an impedance control layer, and a reference potential layer of the flexible circuit board.

The upper connection pads are each of a nonsymmetrical contour structure, where with a center of each of the vias being taken as a reference point, the upper connection pads each have a narrow face-to-face connection pad width between the two adjacent upper connection pads and a wide opposite connection pad width that is distant from the center reference point.

The lower connection pads are each of a nonsymmetrical contour structure, where with a center of each of the vias being taken as a reference point, the lower connection pads each have a narrow face-to-face connection pad width between the two adjacent lower connection pads and a wide opposite connection pad width that is distant from the center reference point.

The efficacy of the present invention is that the attenuation reduction grounding pattern structure allows for excellent impedance matching with the connection pads, reducing the reflection and loss of high frequency components of signals during transmission. Further, the nonsymmetrical contour structure of the connection pads reduces parasitic capacitance between the connection pads for high frequency signals so as to improve impedance matching between the differential mode signal lines and the connection pad zone.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
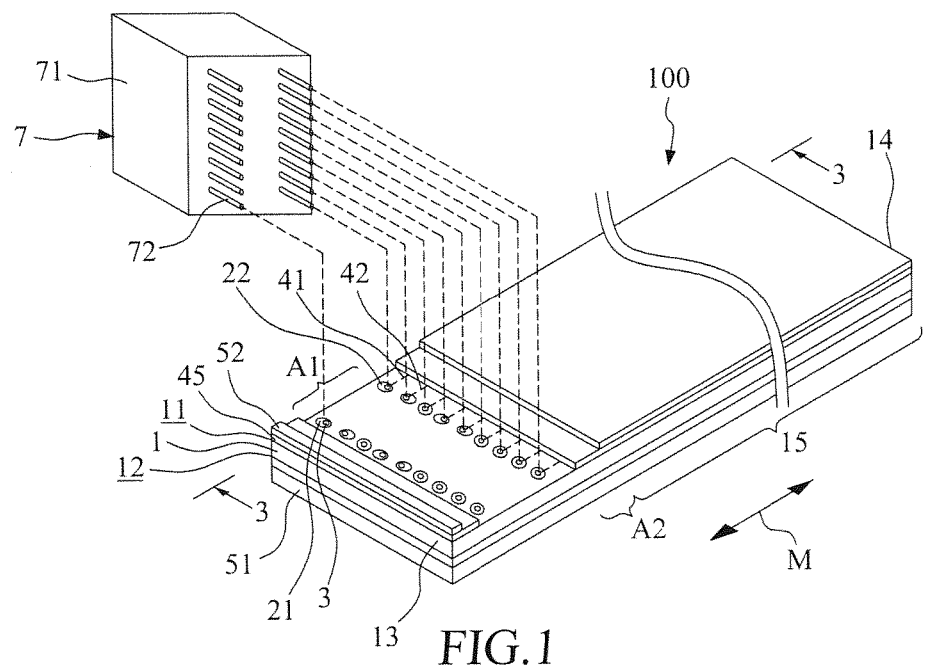
FIG. 1 is a perspective view showing an attenuation reduction structure for high-frequency signal connection pads of a circuit board with an insertion component according to the present invention.
Figure 2:
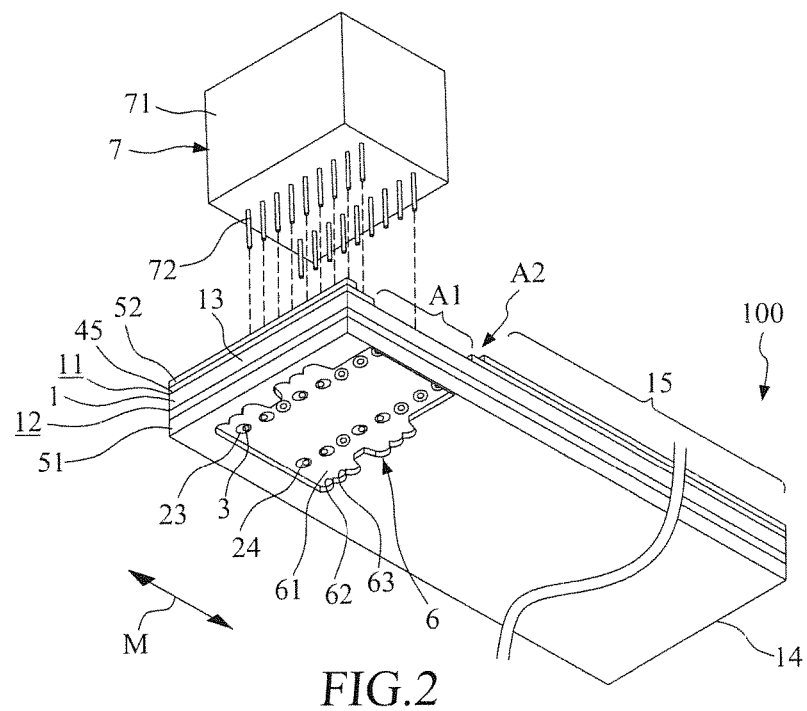
FIG. 2 is a perspective view, taken from a bottom side, showing the attenuation reduction structure for high-frequency signal connection pads of a circuit board with an insertion component according to the present invention.

Referring to FIGS. 1 and 2, FIG. 1 is a perspective view showing an attenuation reduction structure for high-frequency connection pads of a circuit board with an insertion component according to the present invention and FIG. 2 is a bottom-side perspective view thereof. As shown in the drawings, a flexible circuit board 100 comprises a substrate 1. The substrate 1 comprises an upper surface 11, a lower surface 12, a first end 13, a second end 14, and an extension section 15 connected between the first end 13 and the second end 14. The extension section 15 extends in an extension direction M.

The substrate 1 comprises at least one pair of upper connection pads 21, 22 formed on the upper surface 11 and at least one pair of lower connection pads 23, 24 formed on the lower surface 12. The connection pads of each pair of the upper connection pads 21, 22 and the lower connection pads 23, 24 are adjacent to and spaced from each other. The substrate 1 comprises a via arrangement zone A1 defined on the upper surface 11 and the via arrangement zone A1 corresponds to the upper connection pads 21, 22. The via arrangement zone A1 comprises a plurality of vias 3 formed therein and the vias 3 respectively extend through and connect between the upper connection pads 21 and the corresponding lower connection pads 23, and extend through and connect between the upper connection pads 22 and the corresponding lower connection pads 24.

The extension section 15 of the substrate 1 comprises at least one pair of differential mode signal lines 41, 42 formed therein. The differential mode signal lines 41, 42 are adjacent to and spaced from each other and are respectively connected to the upper connection pads 21, 22 that are adjacent to each other to carry and transmit at least one high-frequency differential mode signal. A protective layer 45 is formed on the upper surface 11 of the substrate 1 and an upper surface of the differential mode signal lines 41. A site where the differential mode signal lines 41, 42 and the upper connection pads 21, 22 are connected to each other are defined as a transition zone A2.

The lower surface 12 of the substrate 1 comprises a first metal layer 51 formed thereon. The first metal layer 51 comprises an attenuation reduction grounding pattern structure 6 formed therein to correspond to the transition zone A2. The attenuation reduction grounding pattern structure 6 comprises a hollow area 61 and at least one pair of protruded portions 62, 63. The hollow area 61 corresponds to the via arrangement zone A1 and the hollow area 61 covers the transition zone A2. The protruded portions 62, 63 extend from the first metal layer 51 in a direction toward the lower connection pads 23, 24 to respectively correspond to the differential mode signal lines 41, 42 and each extend by a predetermined length to the transition zone A2. The upper surface 11 of the substrate 1 comprises a second metal layer 52 serving as one of a shielding layer, an impedance control layer, and a reference potential layer of the flexible circuit board 100.

Figure 3:
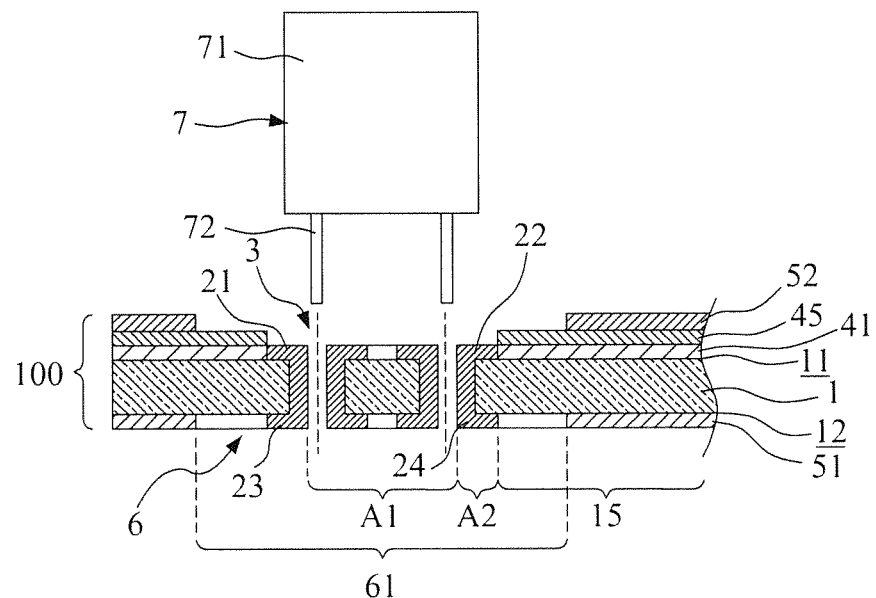
FIG. 3 is a cross-sectional view taken along line 3-3 of FIG. 1.

The present invention is arranged to allow an insertion component 7 to mount to the flexible circuit board 100. The insertion component comprises a component body 71 and a plurality of insertion pins 72 extending from the component body 71. Referring also to FIG. 3, which is a cross-sectional view taken along line 3-3 of FIG. 1, as shown in the drawing, the insertion pins 72 of the insertion component 7 are inserted, in a one-to-one corresponding manner, from the upper surface 11 of the substrate 1 through the vias 3 to project beyond the lower surface 12, and are then soldered and fixed in position to the lower connection pads 23, 24 by solder. Alternatively, the insertion pins 72 of the insertion component 7 are inserted, in a one-to-one corresponding manner, from the lower surface 12 of the substrate 1 through the vias 3 to project beyond the upper surface 11, and are then soldered and fixed in position to the upper connection pads 21, 22 by solder.

Figure 4:
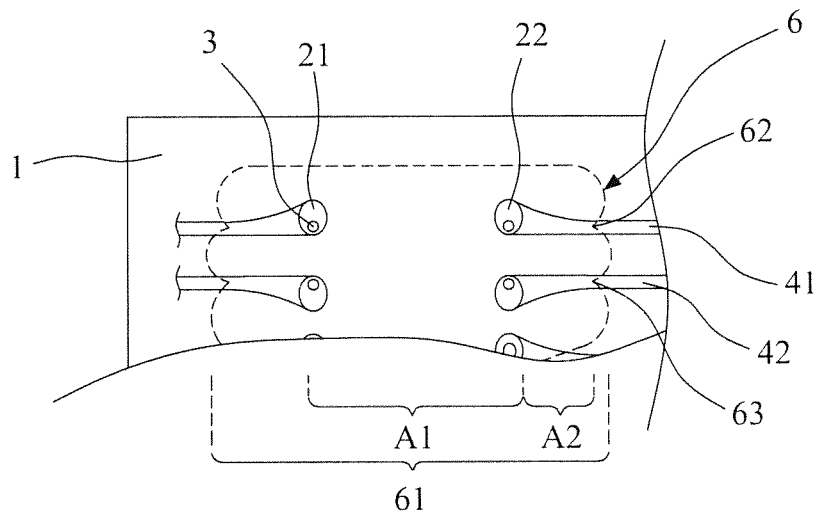
FIG. 4 is a top plan view of FIG. 1.
Figure 5:
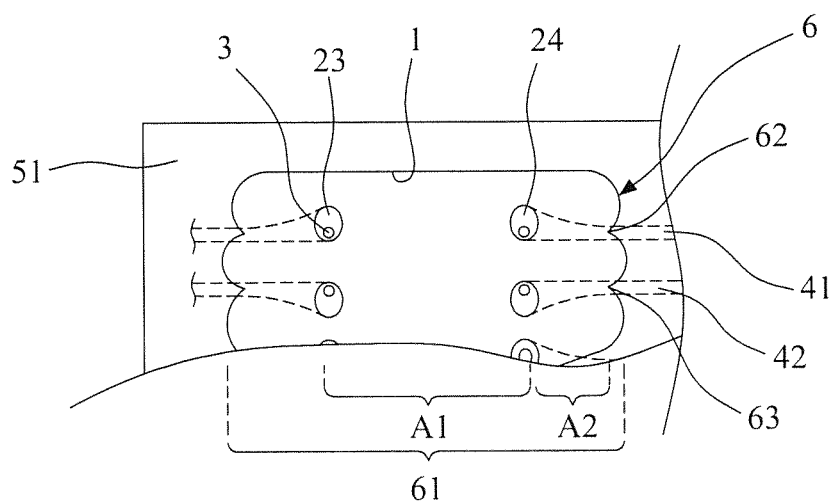
FIG. 5 is a bottom plan view of FIG. 1.

Referring to FIGS. 4 and 5, where FIG. 4 is a top plan view of FIG. 1 and FIG. 5 is a bottom view of FIG. 1, schematic views are provided to illustrate the corresponding relationship between the attenuation reduction grounding pattern structure of the present invention and the lower connection pads, the transition zone, and the differential mode signal lines. As shown in the drawings, the protruded portions 62, 63 each comprise a gradually reducing width. In other words, the protruded portions 62, 63 have a large width at the connection thereof with the first metal layer 51 and the width is gradually reduced in the extension direction toward the lower connection pads 23, 24. The protruded portions 62, 63 are arranged to correspond, in a one-to-one manner, to the differential mode signal lines 41, 42.

Figure 6:
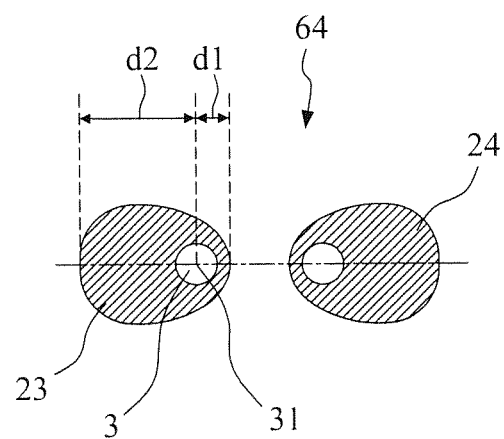
FIG. 6 is a schematic view showing a nonsymmetrical contour structure of a lower connection pad according to the present invention.

Referring to FIG. 6, a schematic view is given to illustrate a nonsymmetrical contour structure of the lower connection pads according to the present invention. As shown in the drawing, the lower connection pads 23, 24 are each of a nonsymmetrical contour structure 64, wherein by taking a center 31 of the via as a reference point, the lower connection pads 23, 24 that are adjacent to each other are structured such that the face-to-face connection pad width d1 of each of the lower connection pads 23, 24 between the end of the pad that is adjacent to the other connection pad and the via center is narrow and the opposite connection pad width d2 of the lower connection pad between the end that is distant from the other pad and the via center 31 is wide. Such a nonsymmetrical contour structure 64 allows the space of the arrangement of the upper connection pads 21, 22 and the lower connection pads 23, 24 not to be limited and the utilization of space among the differential mode signal lines 41, 42 and the vias 3 and the upper and lower connection pads 21, 22, 23, 24.

Figure 7:
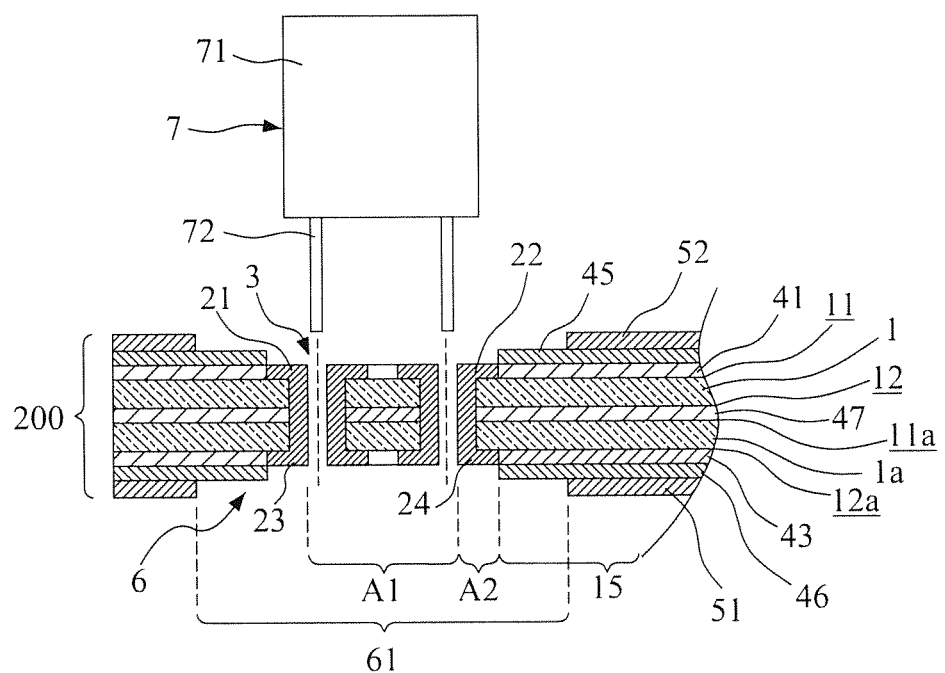
FIG. 7 is a cross-sectional view illustrating an application of the present invention to a double-sided flexible circuit board.

The above description is given to an example of a single-sided flexible circuit board; and application to examples of double-sided or multi-layered circuit board is also possible. Referring to FIG. 7, a cross-sectional view is given to illustrate an application of the present invention to a double-sized flexible circuit board. As shown in the drawing, the double-sided flexible circuit board 200 comprises a substrate 1. The substrate 1 comprises an upper surface 11 and a lower surface 12. The upper surface 11 of the substrate 1 comprises a differential mode signal line 41 formed thereon. An upper surface of the differential mode signal line 41 comprises a protective layer 45 formed thereon and a second metal layer 52 formed on the protective layer 45. The lower surface 12 of the substrate 1 comprises a middle layer 47 formed thereon and a lower substrate 1a formed on the underside of the middle layer 47. The lower substrate 1a comprises an upper surface 11a and a lower surface 12a. The lower surface 12a of the lower substrate la comprises a lower differential mode signal line 43 formed thereon, a lower protective layer 46 formed on the underside of the lower differential mode signal line 43, and a first metal layer 51 formed on the underside of the lower protective layer 46.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An attenuation reduction structure for high-frequency connection pads of a circuit board with an insertion component, wherein:

the circuit board comprises a substrate, the substrate comprising a lower surface, an upper surface, a first end, a second end, and an extension section connected between the first end and the second end, the extension section extending in an extension direction;

at least one pair of lower connection pads are formed on a lower surface of the substrate to be adjacent to and spaced from each other;

at least one pair of upper connection pads are formed in a via arrangement zone defined in an upper surface to the substrate to be adjacent to and spaced from each other and respectively corresponding to the lower connection pads;

at least one pair of differential mode signal lines are formed on the extension section of the substrate to be adjacent to and spaced from each other and respectively connected to the adjacent upper connection pads, the at least one pair of differential mode signal lines transmitting at least one high-frequency differential mode signal, a site where the differential mode signal lines and the upper connection pads are connected to each other being defined as a transition zone;

a plurality of vias is arranged in the via arrangement zone, the vias respectively extending through and connected to the upper connection pads and the lower connection pads; and the insertion component comprises a component body and a plurality of insertion pins extending from the component body;

characterized in that:

the lower surface of the substrate comprises a first metal layer formed thereon, the first metal layer comprising an attenuation reduction grounding pattern structure formed at a location corresponding to the transition zone, the attenuation reduction grounding pattern structure comprising:

a hollow area, which corresponds to the via arrangement zone, the hollow area covering the transition zone; and at least one pair of protruded portions, which extends from the first metal layer in a direction toward the lower connection pads so as to extend a predetermined length to the transition zone and respectively correspond to the differential mode signal lines.

2. The attenuation reduction structure as claimed in claim 1, wherein the insertion pins of the insertion component are respectively inserted from the upper surface of the substrate through the vias to project beyond the lower surface and soldered and fixed in position to the lower connection pads by solder.

3. The attenuation reduction structure as claimed in claim 1, wherein the insertion pins of the insertion component are respectively inserted from the lower surface of the substrate through the vias to project beyond the upper surface and soldered and fixed in position to the upper connection pads by solder.

4. The attenuation reduction structure as claimed in claim 1, wherein the protruded portions each comprise a gradually reducing width such that the protruded portions have a large width at connection thereof with the first metal layer and the width is gradually reduced in the extension direction toward the lower connection pads.

5. The attenuation reduction structure as claimed in claim 1, wherein the upper surface of the substrate further comprises a second metal layer serving as one of a shielding layer, an impedance control layer, and a reference potential layer of the flexible circuit board.

6. The attenuation reduction structure as claimed in claim 1, wherein the upper connection pads are each of a non-symmetrical contour structure, where with a center of each of the vias being taken as a reference point, the upper connection pads each have a narrow face-to-face connection pad width between the two adjacent upper connection pads and a wide opposite connection pad width that is distant from the center reference point.

7. The attenuation reduction structure as claimed in claim 1, wherein the lower connection pads are each of a non-symmetrical contour structure, where with a center of each of the vias being taken as a reference point, the lower connection pads each have a narrow face-to-face connection pad width between the two adjacent lower connection pads and a wide opposite connection pad width that is distant from the center reference point.

\* \* \* \* \*